Oct. 13, 1970 T. M. HYLTIN 3,534,267

INTEGRATED 94 GHz. LOCAL OSCILLATOR AND MIXER

Filed Dec. 30, 1966 4 Sheets-Sheet 1

INVENTOR
TOM M. HYLTIN

E. Mickey Hubbard
ATTORNEY

Oct. 13, 1970 T. M. HYLTIN 3,534,267

INTEGRATED 94 GHz. LOCAL OSCILLATOR AND MIXER

Filed Dec. 30, 1966 4 Sheets-Sheet 2

Oct. 13, 1970 T. M. HYLTIN 3,534,267

INTEGRATED 94 GHz. LOCAL OSCILLATOR AND MIXER

Filed Dec. 30, 1966 4 Sheets-Sheet 3

INVENTOR
TOM M. HYLTIN
E. Mickey Hubbard
ATTORNEY

United States Patent Office 3,534,267

Patented Oct. 13, 1970

3,534,267

INTEGRATED 94 gHz. LOCAL OSCILLATOR AND MIXER

Tom M. Hyltin, Dallas, Tex., assignor to Texas Instruments Incorporated, Dallas, Tex., a corporation of Delaware Filed Dec. 30, 1966, Ser. No. 606,097
Int. Cl. H04b 1/26
U.S. Cl. 325—445 16 Claims

ABSTRACT OF THE DISCLOSURE

A monolithic functional block including a gallium arsenide Gunn oscillator operating at 31.3 gHz. and connected to drive an X3 multiplier, a 93.9 gHz. filter at the output of the multiplier formed by microstrip transmission lines, and a balanced mixer. The circuit is formed on a semi-insulating gallium arsenide substrate which is backed by a metallized ground plane and acts as the insulating layer for microstrip transmission lines formed on the surface of the substrate. The Gunn oscillator, varactor diodes for the frequency multiplier, and mixer diodes for the balanced mixer are formed by lower resistivity gallium arsenide bodies epitaxially grown in pits etched in the gallium arsenide substrate.

BACKGROUND OF THE INVENTION

This invention relates generally to microwave systems, and more particularly relates to radar receivers and the like.

It has long been known that there is a very attractive minimum in the atmospheric absorption of microwave energy centered at approximately 94 gHz. The attenuation at 94 gHz. is approximately 0.3 decibel per kilometer, which is not a great increase over the attenuation experienced at 18 gHz. However, the higher frequency provides the inherent advantages of a narrower antenna beam width and higher gain for a given aperture. Thus, at 94 gHz. the beam width is one-tenth and the gain one hundred times that of an equivalent-area antenna used at the lower frequency of 9.4 gHz. Potential applications in this frequency range are attractive not only because of the small size and high resolution of the antenna, but also by the potential that exists for passive or radiometry detection and imaging. The maximum power output per unit bandwidth from a black body at 290° K. occurs very near the 94 gHz. window. Although imaging can be made on targets of this temperature in the infrared region, the use of the longer wavelength permits imaging through fog, clouds, and in other environments where the shorter infrared wavelength would be attenuated or scattered.

Despite the many advantages of operating in the millimeter wavelength region, only a very limited number of experimental systems are now operating because of the unavailability of transmitter and receiver components. In the past, the magnetrons commonly used for the transmitter and the Klystrons used for the local oscillator were characterized by low power output, short life, extremely high cost, and great fragility. Klystrons for this frequency typically require approximately 3,000 volts for the beam supply, and require precise regulation of several other voltage supplies. The amount of D.C. input required in the previous systems to achieve even a three to five milliwatt power output was on the order of 30 to 50 watts, thus necessitating forced air cooling.

Further, the mixer diodes available for use in these systems, although solid state, have presented additional problems. In a typical 94 gHz. mixer, a silicon die is mounted unpackaged in wave guide section and a point contact is made to the silicon by use of a Phosphor-bronze spring wire that enters the wave guide through a choke section. The IF output and the D.C. bias on the mixer diode are obtained through this connection. A sliding short is located in the wave guide behind the diode, generally several wavelengths from the active area, and a two or three screw tuner section, which must also be located several wavelengths from the diode area, is added to provide the necessary impedance matching. The resulting mixer does in fact work at 94 gHz., but in less than a completely satisfactory manner. Noise figures obtained are generally 15 to 18 decibels for the better structures, and the instantaneous bandwith is generally on the order of 100 mHz. In order to shift the operating frequency an appreciable amount, the entire mixer assembly must be retuned. Thus, the previous systems for operation in this range not only do not operate completely satisfactorily, but also are rather large, are very expensive and have a relatively short useful life.

SUMMARY OF INVENTION CLAIMED

The features claimed singly and in various combinations include a functional monolithic circuit including a Gunn oscillator supplying a local oscillator signal to a mixer for receiving 94 gHz. signals and producing a much lower IF signal; a semi-insulating gallium arsenide substrate acting as a dielectric for microstrip transmission lines and for device isolation, a gallium arsenide Gunn oscillator, a mixer formed by microstrip transmission lines and gallium arsenide-metal mixer diodes; the preceding combinations plus a frequency multiplier coupling the Gunn oscilator to the mixer.

The resulting circuit operates at 94 gHz., yet does not have the disadvantages of the prior art devices described above. The D.C. input to the local oscillator is approximately 2.0 volts at less than 200 milliamperes. The frequency of the local oscillator is electronically tunable over approximately a 10% range by varying the applied voltage to the Gunn oscillator, thus eliminating any mechanical tuning adjustments for either the local oscillator or the mixer. Thus, the bandwidth of the mixer without tuning is approximately the same as is typical for circuits operating at lower frequencies. In addition, the mixer has approximately a 9 gHz. instantaneous bandwidth.

DESCRIPTION OF A PREFERRED EMBODIMENT

Figure 1:
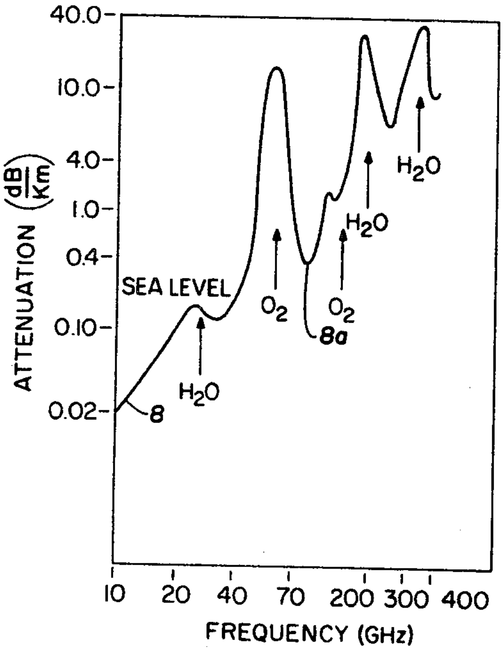
FIG. 1 is a plot of the attenuation of electromagnetic radiation in the frequency range from 10 gHz. to 400 gHz.

Referring now to the drawings, and in particular to

FIG. 1, the curve 8 represents a plot of the attenuation, in decibels per kilometer, of microwave radiation in the atmosphere for frequencies from 10 gHz. to 400 gHz. It will be noted that a very distinct window 8a is centered at about 94 gHz. It is an important object of this invention to provide a local oscillator and mixer for operation at 94 gHz. so that video information carried by 94 gHz. electromagnetic energy can be reduced to an IF carrier at a frequency which can be processed by more conventional circuitry.

Figure 2:
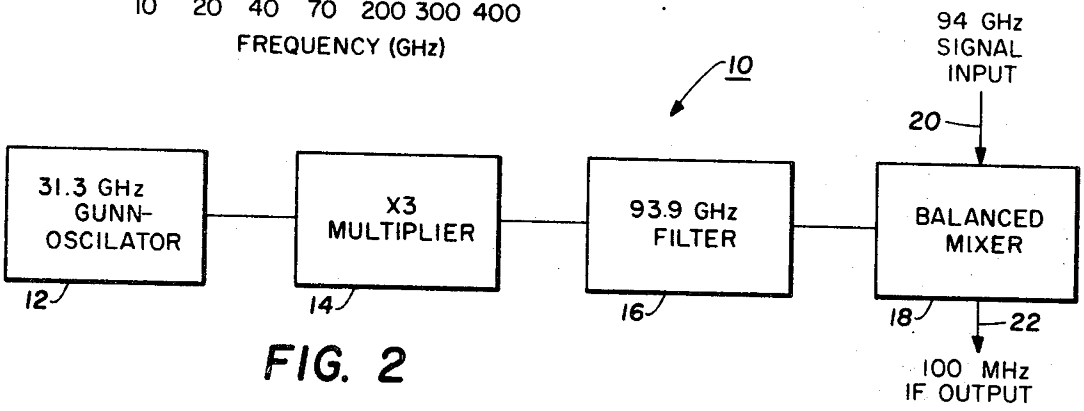
FIG. 2 is a schematic block diagram of a circuit in accordance with the present invention.

Referring now to FIG. 2, a circuit in accordance with the present invention is indicated generally by the reference numeral 10. The circuit 10 is comprised of a Gunn oscillator 12 which is operated at 31.3 gHz. The Gunn oscillator 12 drives an X3 frequency multiplier 14 which produces a 93.9 gHz. local oscillator signal. The output of the frequency multiplier 14 is coupled by a 94 gHz. filter 16 to a balanced mixer 18, where the local oscillator voltage is mixed with the RF signal on input 20 to produce an IF signal on output 22 at about 100 mHz.

In accordance with an important aspect of the invention, the circuit 10 is fabricated on a monolithic slice 24 (see FIG. 3) of semi-insulating gallium arsenide about 0.004 inch thick. A ground plane is formed over the bottom surface of the substrate 24 by a metallized film, which may be D.C. isolated from the gallium arsenide substrate 24 by an insulating layer of silicon dioxide if desired. An important function of the substrate 24 is to provide the dielectric for the microstrip transmission lines which will presently be described.

The Gunn oscillator 12 is comprised of a heavily doped n-type region 26 (see FIGS. 3 and 4) formed in the upper surface of the substrate 24 and a more lightly doped n-type region 28 formed within the heavily doped n-type region 26. Gunn oscillators are generally known and described in the literature. In general, the high resistivity gallium arsenide in the region 28 exhibits a frequency-sensitive negative-resistance effect under the influence of a high electric field established between the low resistivity N+ region 26 and the metallized contact 30 on the higher resistivity region 28. As will hereafter be described in greater detail, the low resistivity region 26 and the higher resistivity region 28 can be formed by successive epitaxial depositions in a pit etched in the surface of the semi-insulating gallium arsenside substrate 24. A fundamental frequency of oscillation as high as 45 gHz. has been obtained from epitaxially formed gallium arsenside layers by the Gunn effect, and it is expected that this frequency will be increased in the immediate future by optimizing fabrication techniques. The oscillator will efficiently produce energy at 31.3 gHz. A sectional view of the Gunn oscillator is illustrated in FIG. 4. Contact is made with the higher resistivity region 28 by a meallized film contact 30, and with the underlying low resistivity region 26 by the meallized contact 32.

The only requirement for operation of the Gunn oscillator is that the load impedance be compatible with maintaining oscillation and providing adequate power output, and that provisions be made for D.C. biasing higher resistivity region 28 through contacts 30 and 32. The load resistance should be between about ten ohms and about forty ohms, with a value of about twenty ohms being typical. In addition, one terminal of the Gunn oscillator must be grounded. A one quarter wavelength, at 31.3 gHz., open ended microstrip stub 34 provides the RF ground by reflecting an RF short to ground back to contact 32. The stub 34 can, of course, be eliminated if an effective RF ground is otherwise provided. D.C. bias is applied to contact 32 by a meandering, high impedance, quarter wavelength choke 36 which terminates in a D.C. bonding pad 38. Pad 38 also forms an RF bypass capacitor to the ground plane. The capacitor thus formed provides an RF short to ground which is reflected to contact 32 as an open circuit and permits the D.C. bias to be applied to the Gunn oscillator while maintaining the D.C. power supply isolated. The microstrip transmission line output of the Gunn oscillator and the multiplier 14 may be designed to exhibit an input impedance within the ten ohm to forty ohm value required for the load resistance of the Gunn oscillator so that no impedance transformation is required between the output of the Gunn oscillator and the frequency multiplier.

Figure 5:
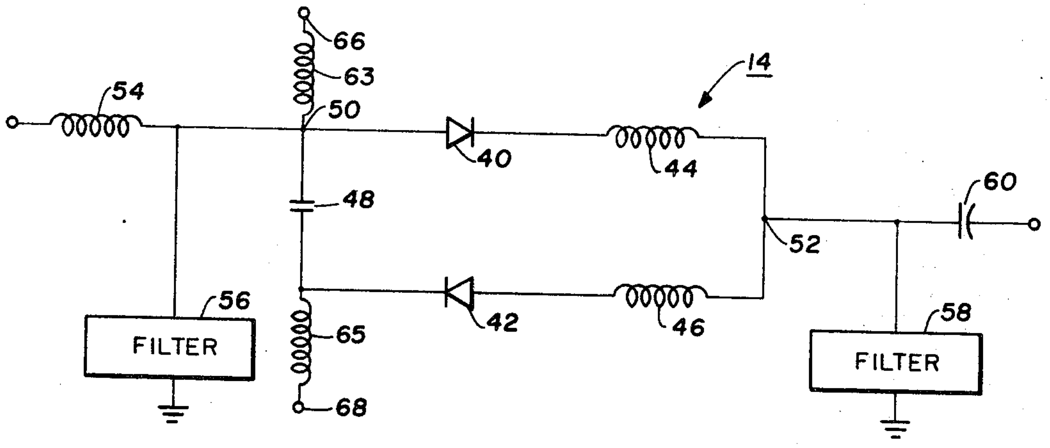
FIG. 5 is a lumped component schematic circuit diagram of the frequency multiplier shown in FIG. 3.

The frequency multiplier 14 is represented generally by the lumped constant schematic circuit diagram of FIG. 5. The multiplier 14 is a balanced tripler having gallium arsenide Schottky barrier varactor diodes 40 and 42 connected in an idler loop with inductors 44 and 46 and a bypass capacitor 48. The inductors 44 and 46 are chosen to resonate with the capacitance of the varactors at the idler frequency. As a result of the idler resonance within the loop, there is a natural cancellation of the idler energy at both the input port 50 and output port 52 of the idler loop. An inductor element 54 is provided at the input to resonate with the varactor-inductance combination of the idler loop at the input frequency of 31.3 gHz., and an input filter 56 is provided to prevent energy flow out of the input port 50 at the output frequency of 93.9 gHz. Similarly, a filter 58 is provided at the output 52 to prevent energy flow out of the output port at the input frequency of 31.3 gHz., and a capacitor 60 is provided at the output to resonate with the varactor-inductance combination at the output frequency of 94 gHz. The diodes 40 and 42 are biased through D.C. bias terminals 66 and 68 and quarter wavelength chokes 63 and 65.

Figure 3:
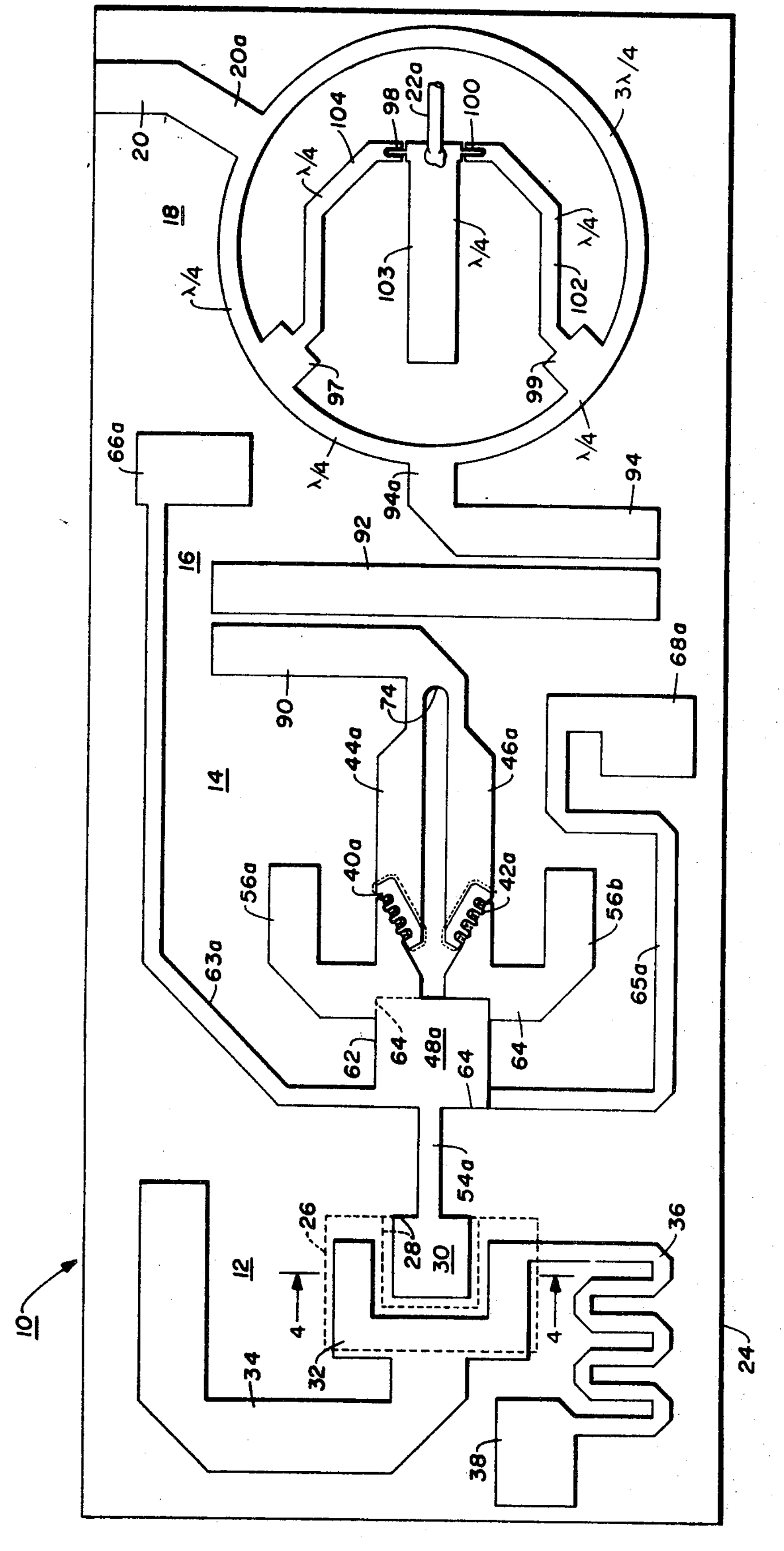
FIG. 3 is a somewhat simplified plan view of a monolithic circuit in accordance with this invention.
Figure 4:
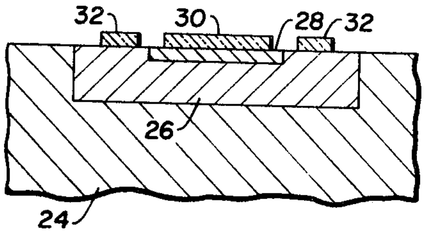
FIG. 4 is a simplified sectional view of the Gunn oscillator and is taken generally on lines 4—4 of FIG. 3.

The multiplier circuit of FIG. 5 is implemented by the structure in FIG. 3 where corresponding components are designated by the same reference numerals followed by the reference character *a*. The microstrip transmission line 54a at the input of the multiplier 14 serves as the inductance 54 and together with the impedance of the diodes 40a and 42a provide the load for the Gunn oscillator 12 necessary to achieve optimum operation. The microstrip line 54a broadens into a plate 62 which overlies a second metallized film 64 shown in dotted outline. The superimposed portions of the strip line 62 and the film 64 form the bypass capacitor 48a of the idler resonance loop. The anode of varactor diode 40a is connected to plate 62, and the cathode of varactor diode 42a is connected to the underlying plate 64. The inductors 44 and 46 are formed by strip lines 44a and 46a. Open ended quarter wavelength stubs 56a and 56b, at the output frequency of 93.9 gHz., extend from plates 62 and 64, respectively, and perform the function of input filter 56 without a ground connection. The open ended stubs reflect the open circuit as a short to ground at the input while simultaneously performing the filter function. D.C. bias for the diodes 40a and 42a is provided through quarter wavelength chokes 63a and 65a, at the input frequency, which are terminated at bonding pads 66a and 68a, respectively. Bonding pads 66a and 68a also form one plate of bypass capacitors which short the RF energy to the ground plane and thus isolate the D.C. voltage supplies.

The output circuitry of the frequency multiplier 14 consists of the quarter wavelength transforming sections 44a and 46a which extend from the varactor diodes 40a and 42a, respectively, and match the output impedance of the varactor to the desired fifty ohm output impedance of the multiplier. The length of transmission line through the impedance matching section and slightly beyond also provides the inductance required for resonating the varactors at the idler frequency. Adjustments in the idler frequency can be obtained by varying the length of the split 74 between sections 44a and 46a.

The output of the multiplier 14 is coupled to the input of a 94 gHz. band-pass filter 16. Filter 16 is of standard microstrip line design and includes a quarter wavelength, at 93.9 gHz., open ended stub 90, an intermediate microstrip line 92, and quarter wavelength, at 93.9 gHz., output stub 94. The filter 16 prevents the 31.3 gHz., out- from the Gunn oscillator or the idler frequency of the multiplier from passing to the input port of the balanced mixer 18, and also provides the reactance of capacitor 60 in FIG. 5 for resonating with the idler loop at the output frequency.

A varactor with a 100 gHz. cutoff frequency at reverse breakdown voltage can multiply from 31.3 gHz. to 94 gHz. with approximately a 4 db loss. In addition, another 1 db loss results in the multiplier circuit and another 2 or 3 db loss results in the band-pass filter 16.. The input impedance of each varactor assuming again the 1,000 gHz. cutoff frequency, is approximately five times the series resistance of the varactor. Therefore, by adjusting the varactor capacitance and series resistance, the input impedance of the multiplier can be adjusted over the impedance range of from 10–40 ohms required to load the Gunn oscillator 12. Cutoff frequencies of 1,000 gHz. at reverse breakdown are easily obtained with the Schottky barrier diode structure which will presently be described, and which can be fabricated having a wide range of capacitance values.

The balance mixer 18 functions in substantially the came manner as a convention "rat race" type hybrid circuit. The balanced mixer 18 includes a microstrip line ring 96. The 94 gHz. input is applied through microstrip line 20 to input port 20*a* and the local oscillator injection voltage is applied through microstrip line stub 94 to input port 94*a*. Energy applied at input port 94*a* is distributed equally between output ports 97 and 99, each of which is located one quarter wavelength from the input port 94*a*, but none of the energy appears at input port 20*a*. Similarly, energy applied at input port 20*a* is divided equally between output port 97, which is one quarter wavelength away, and output port 99, which is three quarter wavelengths away, but does not appear at input port 94*a*. Output ports 97 and 99 are connected by quarter wavelength chokes 102 and 104 and gallium arsenide Schottky barrier mixer diodes 98 and 100 to the IF output which may be a lead 22*a* ball bonded to the pad between the diodes. A quarter wavelength open ended stub 103 forms an output filter by reflecting a short to output 22*a* at 94 gHz.

Semi-insulating gallium arsenide has been defined as being a form of gallium arsenide which has a resistivity greater than $10^4$ ohm-centimeters. Such material can be prepared by adding various doping elements, which produce deep levels, to the gallium arsenide during crystal preparation. High resistivity gallium arsenide can also be obtained without compensation with the doping elements which produce the deep levels by achieving high purity. The semi-insulating gallium arsenide which is preferred for for the substrate 24 is doped with chromium to a level of about 0.5 part per million. The resulting gallium arsenide has a resistivity of from $1\times10^8$ to $5\times10^8$ ohm-centimeters.

Figure 6A:
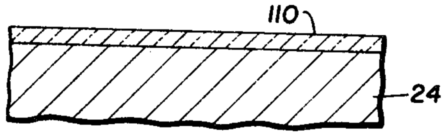
FIGS. 6*a*–6*f* are schematic sectional views which serve to illustrate a process for fabricating the Gunn oscillator illustrated in FIG. 4.
Figure 6D:
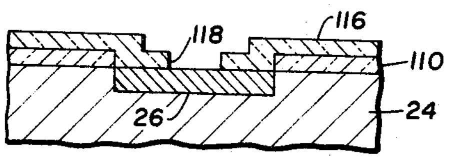
Figure 6B:
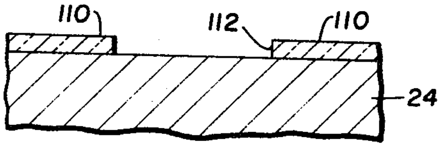
Figure 6E:
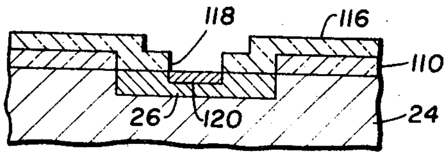
Figure 6C:
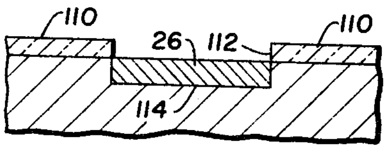
Figure 6F:
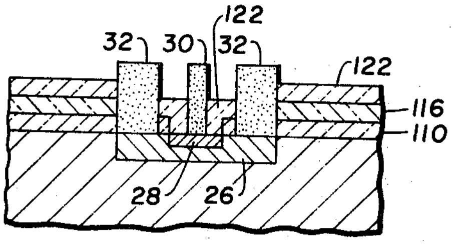

The surface geometry of the Gunn oscillator 12 is illustrated in FIG. 3, and a section is illustrated in FIG. 4. The Gunn oscillator may be fabricated using the process illustrated in FIGS. 6*a*–6*f*. Referring to FIG. 6*a*, the semi-insulating gallium arsenide substrate 24 is coated with a silicon dioxide film 110. An opening 112 (see FIG. 6*b*) is cut in the film 110 using conventional photolithographic techniques to define the area 26 where the heavily doped n-type gallium arsenide is to be formed. Next, the substrate 24 is selectively etched through the window 112 either by an etching solution or an etching vapor to form a pit to depth 114 (see FIG 6*c*). Solutions having a slower etch rate, such as one part $Br_2$ to one thousand parts methanol, are preferred in order to produce pits of controlled depth. Vapor etching can be accomplished by passing a gass stream containing a halide, such as HCl, $H_2AsCl_3$, or $I_2$ over the heated substrate, typically at 850° C. The pit 114 is approximately 25 microns deep and is filled with epitaxially deposited low resistivity gallium arsenide. The gallium arsenide may be grown in the pit by a halide transport process in which hydrogen transports arsenic trichlorode over a mixture of gallium and gallium arsenide at a temperature of about 825° C. The gallium and arsenic are dissolved and entrained in the vapor stream and are transported over the gallium arsenide substrate which is maintained at a lower temperature of about 750° C. to cause the gallium arsenide to deposit on the exposed surface of the substrate. The gallium arsenide may be relatively heavily doped by introducing either $H_2S$ or $S_2Cl_2$ into the reactor during the epitaxial growth. As a result, the gallium arsenide region 26 has a relatively low resistivity formed in the pit 114 and is about 25 microns thick. A second silicon dioxide layer 116 is then formed over the substrate and an opening 118 cut therein as shown in FIG. 6*d* using conventional techniques. The substrate is then exposed to the etchant to etch a pit 120 to a depth of about 5 microns which is then refilled with relatively high resistivity gallium arsenide to form the higher resistivity n-type region 28, as shown in FIG. 6*e*. Then a third oxide film 122 is formed over the substrate and openings cut over the epitaxial regions 26 and 28 to deposit the ohmic contacts 30 and 32 as shown in FIG. 6*f*.

Figure 8:
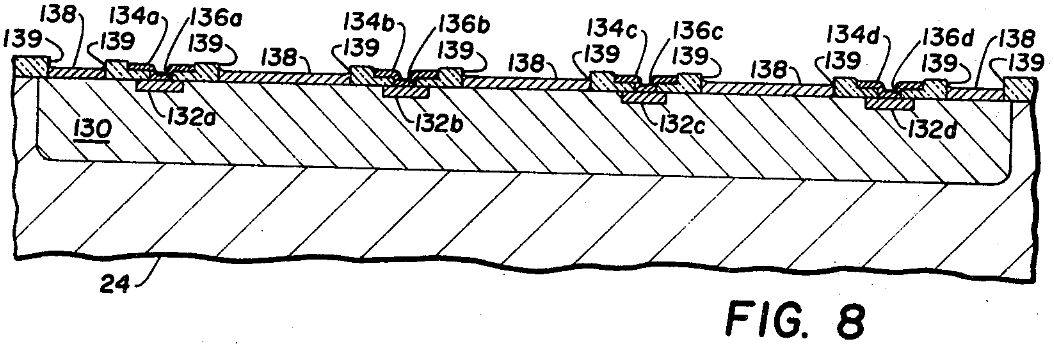
FIG. 8 is a schematic sectional view taken substantially on lines 8—8 of FIG. 7.
Figures 7, 9:
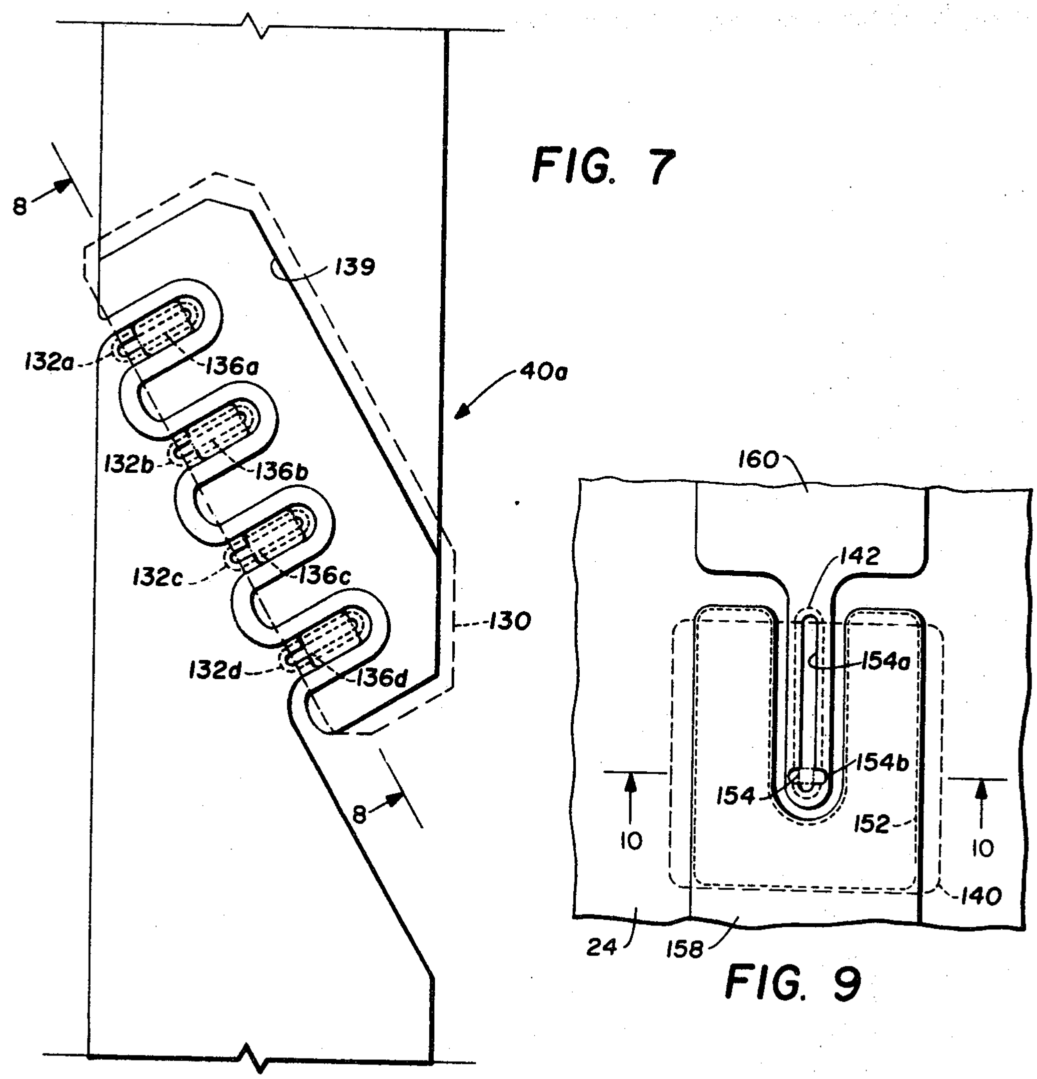
FIG. 7 is an enlarged plan view of one of the diodes used in the frequency multiplier of FIG. 3.
FIG. 9 is an enlarged plan view of one of the diodes used in the mixer of FIG. 3.

The Schottky barrier diodes 40*a* and 42*a* may be fabricated substantially as illustrated in FIGS. 7 and 8. The diodes are gallium arsenide Schottky barrier diodes in which a rectifying junction is formed between a metallic film and a relatively lightly doped n-type gallium arsenide layer. Thus the diode 40*a*, for example, is comprised of a heavily doped, low resistivity gallium arsenide region 130, the plan view of which is indicated by dotted outline in FIG. 7, and which is shown in section in FIG. 8. Four relatively high resistivity n-type gallium arsenide epitaxial regions 132*a*–132*d* are then formed in the heavily doped epitaxial region 130. Fingers 134*a*–134*d* of microstrip line 134 pass through openings 136*a*–136*d* in the oxide layer 137 into rectifying contact with the lightly doped epitaxial regions 132*a*–132*d*, respectively. The extent of the openings 136*a*–136*d* is determined by the area that two crossed elongated openings, put is successive oxide layers, have in common, as shown in the dotted outlines of FIG. 9. A microstrip line 138 passes through an opening 139 in the oxide layer 137 and makes ohmic contact with the low resistivity heavily doped n-type gallium arsenide epitaxial region 130.

The diode 40*a* should be designed with a Q value about thirty times the source frequency, thus requiring a cutoff frequency in excess of 1,000 gHz. The zero bias capacitance should be in the range of 0.05 to 0.1 pico-farad with a voltage swing of 20 volts. If the depth of the epitaxial layers 132*a*–132*d* is about 0.7 micron, reach through will be reached at the 20 volts and a very high cutoff frequency above 1,000 gHz. will be obtained over the entire range of operation. Using the four fingers illustrated in which the openings 136*a*–136*d* are 0.2 mil wide and 0.5 mil long, a capacitance of 0.086 pico-farad is achieved.

Figure 10:
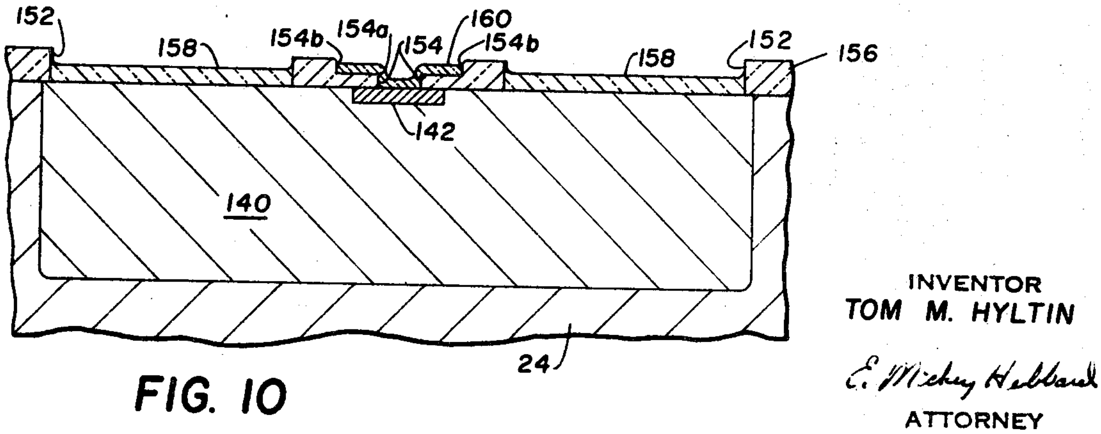
FIG. 10 is a sectional view taken substantially on lines 10—10 of FIG. 9.

The diodes 98 and 100 for the balanced mixer 18 are also gallium arsenide Schottky barrier diodes of the same basic type as the varactor diode 40*a* described in FIG. 7 and 8. However, the mixer diodes will normally have a much smaller metalsemiconductor rectifying junction and may have the geometry shown in FIGS. 9 and 10. A heavily doped, low resistivity n-type region 140 is first epitaxially formed in the semi-insulating gallium arsenide substrate 24. Next, a relatively lightly doped n-type layer 142 of gallium arsenide is epitaxially deposited to a relatively shallow depth within the low resistivity region 140. The sectional views of these sections are shown in FIG. 10, and the plan views are shown by the dotted outline in FIG. 9. Next, openings 152 and 154 (shown in dotted outline in FIG. 9) are cut in the oxide insulating layer 156 over the substrate, and the metal strip lines 158 and 160 passed through the respective openings into contact with epitaxial regions 140 and 142, respectively. Strip line 158 makes ohmic contact with the very low resistivity n-type region 140, and strip line 160 makes a rectifying contact with the lightly doped n-type region 142. The opening 154 is made very small by using the double oxide layer crossed strip technique heretofore mentioned in connection with the transistor shown in FIG 7 and 8. This involves putting a first layer of oxide on the surface of the substrate and opening the aperture 152 and the elongated opening 154*a*. Then a second oxide layer is put over the substrate and the opening 152 again opened up. However, this time only the cross strip 154*b* is opened and the depth of the oxide removal is controlled so that the epitaxial layer 142 is exposed only at the intersection of the two strips 154*a* and 154*b*·

Each of the strips 154*a* and 154*b* is typically 0.1 mil wide, in which case the opening 154 and therefore the area of the rectifying junction is about 0.01 square mil.

The heavily doped epitaxial region 26, required for the Gunn oscillator, and heavily doped regions required for the two varactor diodes 40*a* and 42*a* and the two mixer diodes 98 and 100 can all be formed during the same process step. These layers are typically greater than 5.2 microns deep and are heavily doped to provide a resistivity of about 0.001 ohm/centimeter. However, a separate epitaxial deposition step is generally required for the higher resistivity region of the Gunn oscillator, for the higher resistivity regions of the varactor diodes, and for the higher resistivity regions of the mixer diodes because of the different depths and different impurity concentrations required for optimum performance. At least three separate metal evaporation steps are required to achieve the proper ohmic contacts, the proper rectifying contacts, and the plates of the bypass capacitors along with the strip line patterns. Also, silicon dioxide insulating layers must be deposited, such as by sputtering, to provide the insulating layer between the plates of the bypass capacitors. The final chip on which the circuit shown in FIG. 3 is fabricated is typically 0.035 inch by 4.080 inch by 0.004 inch. Thus, it will be appreciated that a large number of these circuits can be fabricated simultaneously from a single gallium arsenide slice which is nominally about one inch in diameter.

Although a preferred embodiment of the invention has been described in detail, it is to be understood that various changes, substitutions and alterations can be made therein without departing from the spirit and scope of the invention as defined by the appended claims.

What is claimed is:

1. In a microwave circuit, the combination of:
(a) a monolithic semi-insulating gallium arsenide substrate having substantially parallel major faces,
(b) a Gunn oscillator formed by a high resistivity gallium arsenide region in one major face and biasing circuit means formed by patterned conductive films extending over said one major face,
(c) a frequency multiplier formed by patterned conductive films extending over said one major face and at least one Schottky barrier varactor diode formed between a high resistivity gallium arsenide region in said one major face and a metallized film, the input of the frequency multiplier being connected to the output of the Gunn oscillator,
(d) a mixer formed by patterned conductive films extending over said one major face and at least one Schottky barrier mixer diode formed between a high resistivity gallium arsenide region in said one major face and a metallized film, the local oscillator input of the mixer being coupled to the output of the frequency multiplier, and
(e) a metallized ground plane extending over a major portion of the other major face whereby strips of the metallized films on said one major face will form microstrip transmission lines using the substrate as the dielectric.

2. The combination defined in claim 1 wherein:
(a) the frequency multiplier produces a local oscillator signal of about 93.9 gHz., and
(b) the mixer is adapted to mix the 93.9 gHz. local oscillator signal with 94 gHz. RF signals to produce an IF signal of about 100 mHz.

3. The combination defined in claim 1 wherein the Gunn oscillator is formed by:
(a) a first low resistivity n-type gallium arsenide region in the substrate,
(b) a second higher resistivity n-type gallium arsenide region in the first gallium arsenide region, both the first and second regions being exposed at said one major face,
(c) a first metallized film in contact with one of the regions,
(d) a second metallized film in contact with the other of the regions,
(e) means connected to one of the metallized films for RF grounding the film, and
(f) means connected to one of the metallized films for applying a D.C. bias to the metallized film while maintaining the bias supply isolated from the oscillator signal.

4. The combination defined in claim 3 wherein:
(a) the first metallized film is in contact with the first region,
(b) the means for RF shorting the film to ground comprises a quarter wavelength open ended strip line stub connected to the first metallized film, and
(c) the means for applying a D.C. bias to the metallized film comprises a quarter wavelength strip line choke connected to the first metallized film at one end and a bypass capacitor RF coupling the other end of the strip line choke to ground.

5. The combination defined in claim 1 wherein the frequency multiplier is comprised of:
(a) a pair of Schottky barrier varactor diodes formed in said one major face of the substrate, each diode comprising a low resistivity gallium arsenide contact region formed in the substrate and a higher resistivity gallium arsenide region formed in the low resistivity gallium arsenide region,
(b) an input circuit comprised of a pair of capacitively coupled film plates forming a bypass capacitor, one of the plates being connected to the low resistivity contact region of one diode by an ohmic contact and the other plate being connected to the higher resistivity region of the other diode by a rectifying contact,
(c) an output circuit comprised of a pair of inductively coupled strip transformer sections, each transformer section being connected to the region of one of the diodes that is not connected to one of the plates and being interconnected at the other end to form the output of the frequency multiplier,
(d) an open ended quarter wavelength, at the output frequency of the multiplier, strip line stub connected to each of the plates, and
(e) means for applying a D.C. bias to each of the plates to forward bias the diodes.

6. The combination defined in claim 5 further characterized by a filter comprising:
(a) an open ended quarter wavelength, at the output frequency of the multiplier, strip line stub connected to the output of the multiplier,
(b) a strip line transformer section inductively coupled to the quarter wavelength strip line stub, and
(c) a second quarter wavelength, at said output frequency, strip line stub inductively coupled to the strip line transformer section.

7. The combination defined in claim 1 wherein the mixer comprises a strip line ring having a local oscillator signal input port, an RF signal input port and a pair of output ports, the input ports being located an even number of quarter wavelengths apart in both directions around the ring, and each of the input ports being located an odd number of quarter wavelengths away from each of the output ports in both directions around the ring, a quarter wavelength strip line choke connecting each of the output ports to one terminal of a Schottky barrier gallium arsenide mixer diode, the other terminals of the mixer diodes being connected to a IF output, and an open ended, quarter wavelength strip line stub connected to the IF output to filter out the RF signal and local oscillator signal frequencies.

8. In a microwave circuit, the combination of:

(a) a semi-insulating gallium arsenide substrate having substantially parallel major faces, (b) a relatively low resistivity gallium arsenide region formed in one of the major faces, and (c) a relatively high resistivity gallium arsenide region formed in the relatively low resistivity gallium arsenide region to form a Gunn oscillator, (d) a metallized ground plane over the other major face, (e) a first metallized film over a portion of said one face of he substrate exending into contact with the relatively low resistivity gallium arsenide region, the first metallized film forming an open ended strip line one quarter wavelength long at the chosen frequency of oscillation of the Gunn oscillator to provide an RF ground, (f) a second metallized film over a portion of said one face of the substrate extending into contact with the relatively high resistivity gallium arsenide region and forming an output, and (g) means for applying a D.C. bias to each of the first and second metallized films while isolating the D.C. bias supplies from the oscillator signals produced by the Gunn oscillator.

9. The combination defined in claim 8 wherein the means for applying a D.C. bias to the first and second metallized films comprises extensions of each of the films to form quarter wavelength chokes each of which is RF terminated at ground and at least one of which is coupled to ground by a bypass capacitor.

10. The combination defined in claim 8 wherein each of the gallium arsenide regions is an epitaxial region characterized by substantially uniform distribution of the respective doping impurities throughout the respective regions.

11. A monolithic functional electronic block comprising:

(a) a high resistivity semiconductor substrate of predetermined thickness;

(b) a conductive layer over one surface of said substrate;

(c) a local oscillator formed on another face of said substrate for producing a desired frequency, said local oscillator includes a Gunn oscillator formed by a region of said substrate and microstrip transmission lines;

(d) a frequency multiplier for multiplying the frequency produced by said local oscillator to produce a predetermined local oscillator signal, said multiplier includes varactor diodes formed in said substrate and microstrip transmission lines;

(e) a mixer formed on said substrate for mixing said local oscillator signal with an RF signal to produce an IF signal, said mixer includes mixer diodes formed in said substrate and microstrip transmission lines.

12. The monolithic functional electronic block of claim 11 wherein (a) said substrate is semi-insulating gallium arsenide; and wherein (b) said varactor diodes and mixer diodes are gallium arsenide Schottky barrier diodes.

13. The monolithic functional electronic block of claim 11 wherein (a) said local oscillator produces a frequency of about 31.3 gHz.; and wherein (b) said multiplier produces a local oscillator signal having a frequency of about 93.9 gHz.; and wherein (c) said RF signal is about 94 gHz.; and wherein (d) said IF signal is about 100 mHz.

14. The monolithic functional electronic block of claim 11 wherein said microstrip transmission lines utilize said substrate as a dielectric and said conductive layer as a ground plane.

15. In a microwave circuit, the combination of a semi-insulating gallium arsenide substrate having substantially parallel major faces, a mixer formed on one major face comprising a strip line ring having a local oscillator signal input port, an RF signal input port and a pair of output ports, the input ports being located an even number of quarter wavelengths apart in both directions around the ring, and each of the input ports being located an odd number of quarter wavelengths away from each of the output ports in both directions around the ring, a quarter wavelength strip line choke connecting each of the output ports to one terminal of a Schottky barrier gallium arsenide mixer diode, the other terminals of the mixer diodes being connected to an IF output, and an open ended, quarter wavelength strip line stub connected to the IF output to filter out the RF signal and local oscillator signal frequencies, and a metal layer over the other major face whereby the substrate will form the dielectric and the metal layer the ground plane for the strip transmission lines of the mixer.

16. The combination defined in claim 15 wherein the mixer is tuned to mix a local oscillator signal of about 93.9 gHz. with an RF signal of about 94 gHz. to produce an IF signal of about 100 mHz..

References Cited

UNITED STATES PATENTS

| | | | |
|---|---|---|---|
| 3,339,153 | 8/1967 | Hakki | 331—107 |
| 3,370,995 | 2/1968 | Lowery | 317—235 |
| 3,443,169 | 5/1969 | Foxell et al. | 317—234 |

OTHER REFERENCES

Hasty et al.: 1EEF Transactions on Electron Devices, "Microwave Oscillations in Epitaxial Layers of GaAs," vol. ED–13, No. 1.

ROBERT I. RICHARDSON, Primary Examiner

U.S. Cl. X.R.

317—234; 331—107